(12) United States Patent
Wilkins et al.

(10) Patent No.: US 6,697,763 B1
(45) Date of Patent: Feb. 24, 2004

(54) MEASUREMENT MODULE AND SYSTEM FOR MONITORING THE STATUS OF ARMORED VEHICLE ELECTRONIC COMPONENTS

(75) Inventors: Debora Wilkins, Madison, AL (US); Kenneth M. Finklea, Jr., Madison, AL (US); Calvin Nunley, Madison, AL (US); Gary Steven Swartz, Huntsville, AL (US)

(73) Assignee: PEI Electronics, Inc., Huntsville, AL (US)

( * ) Notice: Subject to any disclaimer, the term of this patent is extended or adjusted under 35 U.S.C. 154(b) by 0 days.

(21) Appl. No.: 09/455,858

(22) Filed: Dec. 7, 1999

(51) Int. Cl.[7] ............................................. G06F 15/00
(52) U.S. Cl. ........................... 702/183; 326/27; 701/35; 702/187; 713/320
(58) Field of Search ................................. 702/182, 183, 702/185, 187; 714/17, 26, 37, 46; 701/1, 29, 32, 35, 99; 73/866.1; 712/32; 710/300; 703/2; 326/37; 713/320

(56) References Cited

U.S. PATENT DOCUMENTS

| | | | |
|---|---|---|---|
| 4,757,463 A | 7/1988 | Ballou et al. ................... 701/35 |
| 4,799,126 A | 1/1989 | Kruse et al. ................... 361/101 |
| 4,809,177 A | 2/1989 | Windle et al. .................. 701/1 |
| 5,034,894 A | 7/1991 | Abe ............................ 701/99 |
| 5,056,023 A | 10/1991 | Abe ............................ 701/32 |
| 5,211,063 A | 5/1993 | Hobmaier et al. ........... 73/866.1 |
| 5,450,321 A | 9/1995 | Crane .......................... 701/35 |
| 5,544,308 A | 8/1996 | Giordano et al. ............. 714/26 |
| 5,586,057 A | 12/1996 | Patel .......................... 702/185 |
| 5,594,646 A | 1/1997 | Itoh et al. .................... 701/35 |
| 5,600,576 A | * 2/1997 | Broadwater et al. ......... 702/187 |
| 5,631,831 A | 5/1997 | Bird et al. .................... 701/29 |
| 5,754,451 A | 5/1998 | Williams ..................... 702/185 |
| 5,771,064 A | 6/1998 | Lett ............................ 725/134 |
| 5,809,437 A | 9/1998 | Breed .......................... 701/29 |
| 5,870,621 A | 2/1999 | Walsh et al. .................. 712/32 |
| 5,948,092 A | 9/1999 | Crump et al. ................. 710/300 |
| 5,987,617 A | * 11/1999 | Hu et al. ..................... 713/320 |
| 6,094,063 A | * 7/2000 | St. Pierre et al. ............ 326/37 |
| 6,102,958 A | * 8/2000 | Meystel et al. ............... 703/2 |

OTHER PUBLICATIONS

Universal Serial Bus Specification Revision 1.1 Compaq Computer Corporation, Intel Corporation, Microsoft Corporation, NEC Corporation Sep. 23, 1998.

* cited by examiner

*Primary Examiner*—John Barlow
*Assistant Examiner*—John Le
(74) *Attorney, Agent, or Firm*—Russell Carter Gache Sirote & Permutt, P.C.

(57) ABSTRACT

A testing apparatus and method consisting of multiple measurement modules having one or more circuit assembly boards, two data/power connectors, and a target connector. Signal data is accessed from 1–128 target signal sources and sampled through two separate analog to digital channels. An on-board microcontroller controls signal selection and data sampling rates and also provides for transfer of recorded data over a USB bus to a host computing device. Using a proper testing application loaded onto the host computing device, each module can be commanded to access and store representative data from a number of signal sources at each target system. Each module is connected to other modules and a host computing device to create a complete self-powered test access environment. The interconnectivity of the system makes diagnosing electronic component failures in an armored vehicle, such as a tank, much easier than prior manual fault isolation procedures.

6 Claims, 9 Drawing Sheets

MEASUREMENT MODULE AND SYSTEM FOR MONITORING THE STATUS OF ARMORED VEHICLE ELECTRONIC COMPONENTS

FIELD OF THE INVENTION

The present invention relates generally to measurement appliances and diagnostic testing equipment. More specifically, the present invention relates to data measurement devices and in particular to digital measurement collection devices.

BACKGROUND OF THE INVENTION

Military armored vehicles have increased greatly in complexity over the last 50 years. Tanks in particular have undergone radical improvements over that period and today bristle with internal electronics. Internal electronics of the modern tank not only augment offensive capabilities, but also now support primary power systems, such as propulsion and power transmission. The augmentation of internal tank systems with electronics allows for precise monitoring of maintenance schedules and the recording of historical performance of subsystems for later maintenance analysis. In turn, improved monitoring procedures based upon augmented internal electronics has led to overall operational readiness of our tank forces.

Increased complexity of internal electronics for modern armored vehicles has led to a new complexities and in particular has led to difficulty in monitoring internal failures in vehicle component electronics or Line Replaceable Units ("LRUs") as they are commonly referred to.

In the past and currently with some vehicles such as the M1A1, tank fault isolation consisted of "fix-on-failure" response or repair through manual fault isolation procedures, typically with the assistance of detailed technical manuals. The former is unacceptable since a critical failure in an electronic component in the field can have disastrous effects on a tank command's readiness. The latter, on the other hand, requires cumbersome test equipment, including testing interface boxes, specialized cables, and adapters, and an array of technical manuals. Much of which is difficult or impossible to apply in field operations. The test set currently being used for the M1 is the Simplified Test Equipment—M1 Series Vehicle and M2/M3 Fighting Vehicle Systems, or STE-M1/FVS for short. A high level of experience and expertise is required by an operator of STE-M1/FVS test equipment.

In response, some newer tanks have features that assist in fault isolation procedures. For example, the Bradley Fighting Vehicle has a system 1553 data bus which may be used to run Built-In-Test ("BIT"). A run-time BIT allows for isolation to a specific ambiguity group, but additional test equipment must be utilized to break the ambiguity to a specific LRU. Moreover, even with the advent of a data bus that supports testing, all current fault isolation testing must be performed in a non-operational maintenance mode, and testing equipment must still be carried to the vehicle with the associated removal of installed operational cables to each LRU in favor of the testing cables. Therefore, fault isolation of LRUs in current armored vehicles is difficult and limited in availability.

Therefore, there exists a need in our current fleet of military armored vehicles, such as tanks, for an apparatus that will allow for measuring performance and evaluating the status of LRUs while still in full operational combat mode.

SUMMARY OF THE INVENTION

It is the object of the present invention to provide an apparatus that collects data from line replaceable units in an armored vehicle.

It is a further object of the invention to provide a method for collecting data on electronic systems in an armored vehicle.

It is yet a further object of the invention to provide a system of interconnected measurement modules that collect selected data from assigned electronic sub-systems of an armored vehicle over an integrated testing network and pass that data to a host computing device for analysis.

In summary, the invention consists of a measurement module having one or more circuit assembly boards, two data/power connectors, and a target connector to access target signals. The circuit assembly boards include electronics for accessing and storing selected signal data emanating from the connected target system. Signal data may be accessed from 1–128 target signal sources and sampled through two separate channels. An on-board microcontroller controls signal selection and data sampling rates and also provides recorded data transfer over a USB bus to a host computing device. The host computing device has the capability of running a testing application for sending commands to each measurement module to retrieve target signal data from the module's buffer memory. Using proper testing application functions from the host computing device, each module can be commanded to access and store representative data from a number of signal sources at each target system. Each module can be connected to another module, and to the host computing device over the USB. The host computer device may be detachably connected to the USB, and there-through to the modules, at will. Power is provided via the interconnecting cables to each module.

Other features and objects and advantages of the present invention will become apparent from a reading of the following description as well as a study of the appended drawings.

BRIEF DESCRIPTION OF THE DRAWINGS

A measurement module and system incorporating the features of the invention are depicted in the attached drawings which form a portion of the disclosure and wherein.

DESCRIPTION OF THE PREFERRED EMBODIMENTS

Figure 1:
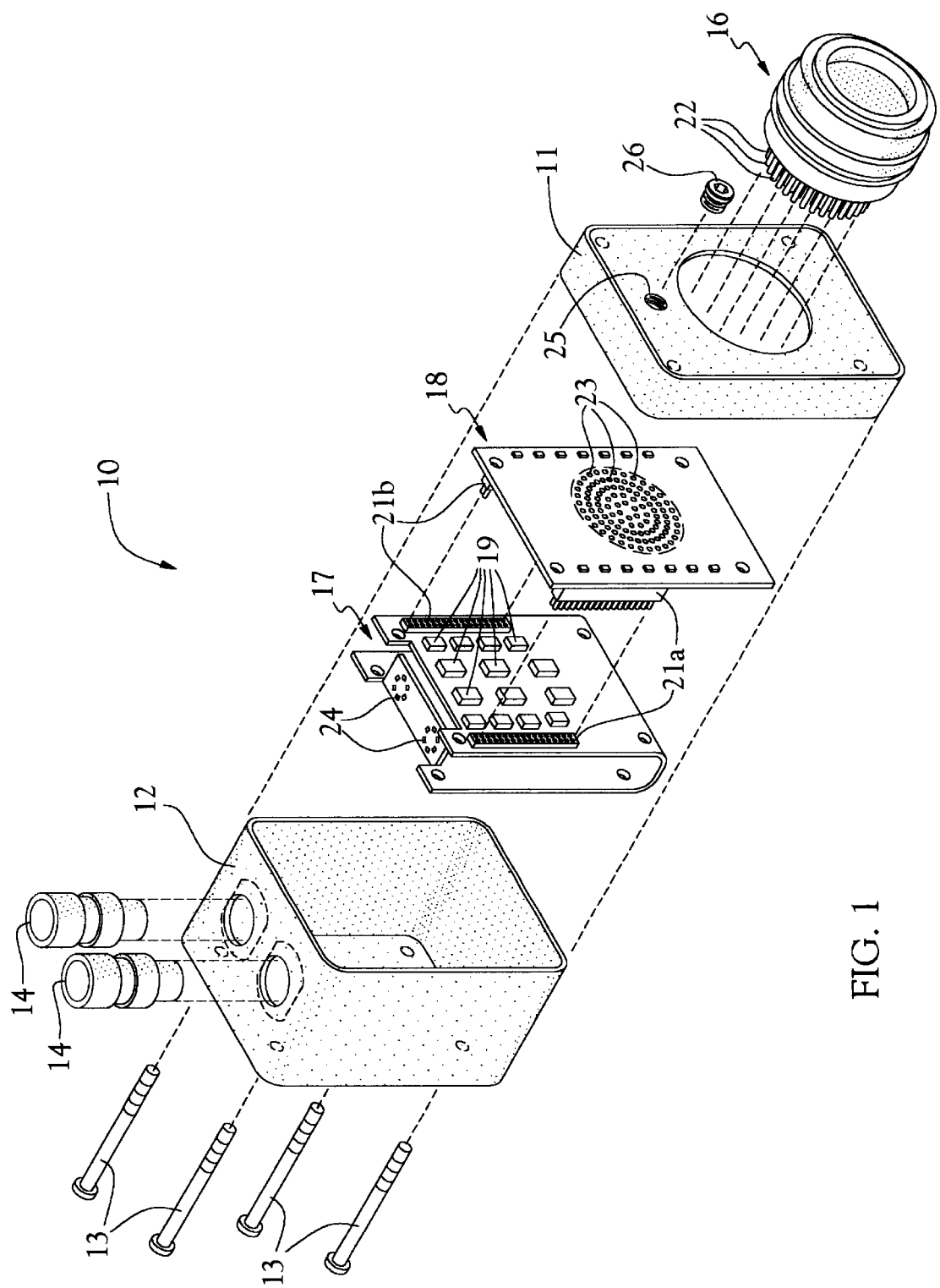
FIG. 1 is an exploded perspective view of the measurement module.

Referring to the drawings for a better understanding of the function and structure of the invention, it will be shown that generally the invention comprises a series of measurement modules interconnected via a high-speed USB bus and connected to a host computing device. The measurement modules are assigned and electrically connected to preselected LRU target component sub-systems of an armored vehicle, such as a tank. The LRUs can be anything from complex communications and target identification sub-systems to simple power transmission RPM shaft encoders. Measurement modules can be mounted directly to or inside an existing LRU, or can be fully integrated into the electronics of an LRU. A host computing device, such as an on-board controller or a connected notebook computer having the necessary USB drivers, controls the access and assimilation of data from each target system through the measurement modules.

Referring to FIG. 1 for a better understanding of the measurement module, it may be seen that the module 10 includes a two piece housing having a top portion 111 and a bottom portion 12. Screws 13 secure the top and bottom portions together that hold the internal electronics. The housing pieces are made of material suitable for the module and internal components to meet military specifications such as temperatures ranging from −40° C. to +85° C. while in operation and −55° C. to +125° C. for storage. Two data/power connectors 14 extend from the upper side of the module for connection to the upstream and downstream paths of the USB. A connector 16 electrically connects the module to an assigned target system.

Housed within the module 10 are electronics for capturing target system data. Two circuit card assemblies 17, 18 hold a series of integrated circuits 19 that implement the functions of the module. Circuit card assembly 17 comprises a folded rigid-flex multi-layered composite board onto which integrated circuits 19 are soldered. Assembly 18 is a conventional multi-layered plastic substrate also holding soldered components. Both boards have circuits soldered to both sides. Assemblies 17 and 18 are connected together through header connectors 21a,b and through which they communicate. Assembly 18 includes a series of resisters and diodes to provide for electrical isolation of target system inputs to protect against surges that may damage integrated circuits on assemblies 17 and 18.

As may be seen, connector 16 has a series of solder contacts 22 that mate with contacts 23 to provide 128 potential electrical signal sources to the module electronics. The data/power connectors 14 are soldered onto solder pads 24 to connect directly to the module integrated circuit electronics 19. An access port 25 is provided to allow the introduction of potting compound into the interior of the module and a set screw 26 is applied to seal the port after the potting process. Internal application of potting compound allows for a more rigid and environmentally sealed module.

Assemblies 17, 18, the connectors 14, 16, and housing portions 11, 12 combine into a solid, unitary assembly through strategic use of internally positioned flanges and penetrating housing screw holes as shown. Flanges on connectors 14 and 16 in combination with appropriate "O" rings create a sealed unit allowing the module to meet stringent military specifications.

Figure 2:
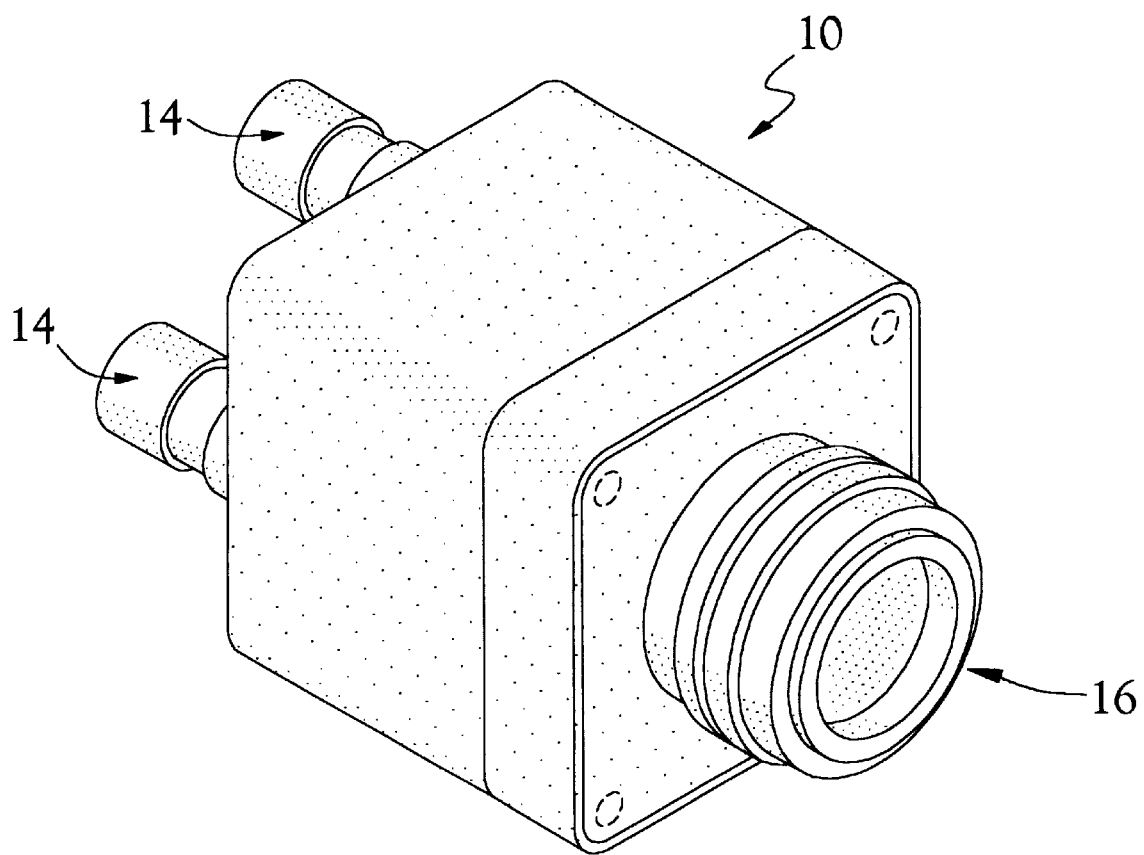
FIG. 2 is a perspective view of an alternate embodiment of the measurement module.

Referring to FIG. 2, module 10 can be configured with alternate positioning of the connectors as shown to facilitate alternate LRU compatibility. Also, this embodiment simplifies the electronics of the measurement module 10 by allowing direct soldering of all connectors to the circuit assemblies in a static orthogonal relationship. Multiple circuit assemblies can be stacked on top of one another. Stacking of multiple composite circuit assemblies can also be accomplished using a single folded, rigid-flex assembly.

Figure 3:
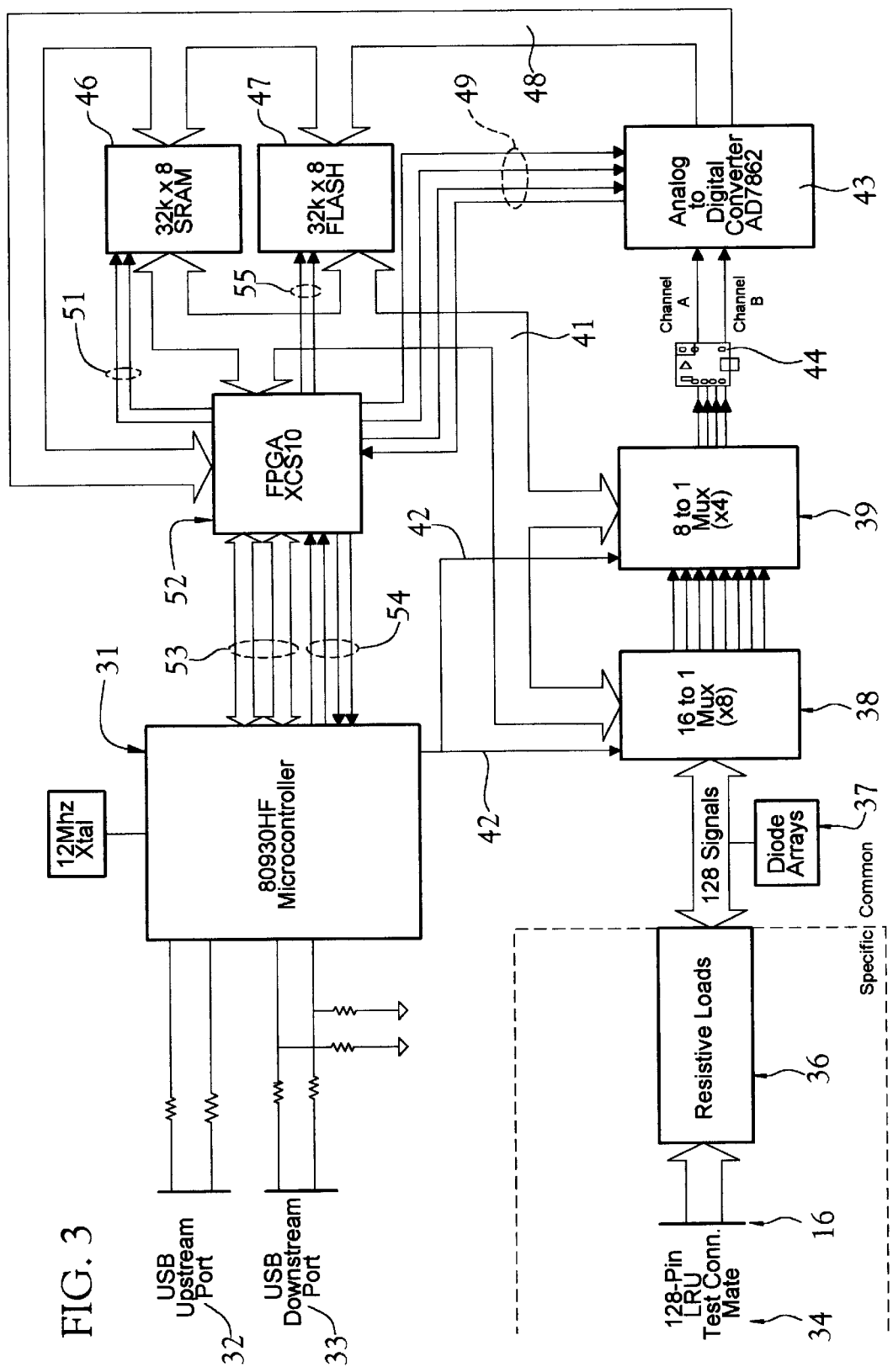
FIG. 3 is a system component schematic of the electronics of the measurement module.

Referring now to FIG. 3, each measurement module 10 includes several integrated circuits that comprise the module electronics. A microcontroller 31 controls the module electronics in response to commands sent from a host computing device and also controls communications via a high speed USB bus. Commands and data are transceived via upstream 32 and downstream 33 ports. The general duties of the microcontroller encompass controlling the module electronics to receive commands from a host computing device and configuring other module electronics in response thereto, and to upload stored data from a target system to the host computing device upon request. A suitable microcontroller for the present invention is an Intel 80930 which has built-in input/output (I/O) support for USB, and which may access both internal and external program instructions.

Connection to a target LRU is achieved through a 128 pin connector 34 mating into connector 16. Connector 16 is then soldered onto circuit card assembly 18 which holds a series of resistive loads 36 customized to match the electrical conditions of the target system. An array of diodes and other line conditioning circuitry 37 protects the module's internal electrical components from damage caused by voltage spikes and general ESD attacks. Exemplary products used in the line conditioning circuitry are a switching diode array part number MMAD1 103 manufactured by Microsemi and TVS diodes P/Ns SM05–36 manufactured by Semtech Corporation.

Twin multiplexers 38 and 39 provide for 16 to 1 and 8 to 1 channel selection, respectfully, thereby allowing for selection of up to 128 different signal sources from the 128 pin test connector 16. Analog devices makes analog multiplexers having a part numbers AD426 and ADG428 that satisfy the functional requirement of 38 and 39, respectively. Source selection through 38 and 39 is achieved through 16 bit bus addressing 41 and control lines 42.

Analog to digital converter (A/D) 43 provides sampling and conversion of up to two selected source signals into digital data for storage in static ram buffer (SRAM) 46. A/D 43 outputs data over a 12 bit data bus 48. A/D 43 includes dual channels A/B from which simultaneous sampling may occur. Amplifier circuitry 44 further conditions a selected source signal into the A/D 43. Suitable industry parts for 43 and 44 are Analog Devices AD7862 and instrumentation amplifier AD622, respectively. Control lines 49 allow sampling control over various parameters such as conversion rate, reference signal input, and channel selection.

Field programmable (gate) array 52 includes glue logic and logical state machines for control over A/D 43, SRAM 46, and Flash Programmable Memory 47. FPGA 52 communicates with microcontroller 31 over two 8 bit buses that allow for a 16 bit address path 53 as well as 4 additional control lines 54. Control lines 51 and 55 allow for the distribution of control signals to the SRAM and Flash Memory 47. A suitable SRAM for the module electronics is a Cypress Semiconductor CY62256 32K×8 static ram, and Atmel makes a suitable Flash programable 256K (32k×8) memory AT29C256. The FPGA may be any one of a variety of field programmable arrays suitable for the herein described functions.

Flash Programmable Memory 47 contains the firmware for control of the microcontroller 31. Instructions are written and saved in the firmware memory 47 to control the operation of the module 10 at the time of manufacture. Microcontroller 31 accesses firmware instructions over bus 41 through FPGA 52. Since the AT29C256 is erasable, any module 10 may be updated and upgraded to accommodate a new firmware store on demand.

Figure 4A:
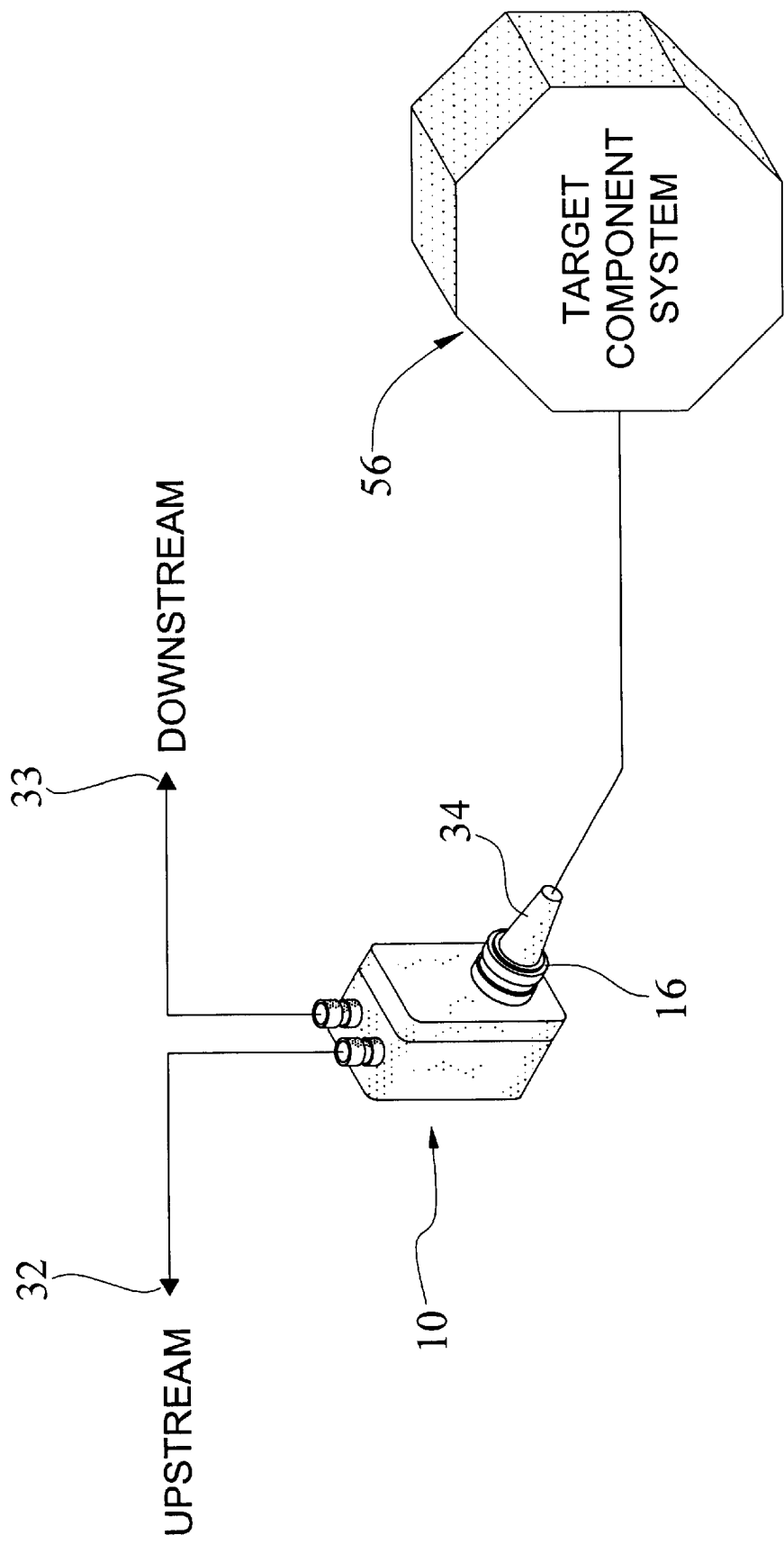
FIG. 4A is combined perspective and diagrammatic illustration of the relationship between the measurement module, an associated target system, and the connecting USB bus.

As shown in FIG. 4A, a measurement module 10 is connected to a target component system or LRU 56 via a connector 16–34. Up to 128 signals are connected to selected signal sources into the target system and routed back to the module connection. The positioning of the module relative to the target system can be accomplished in a number of ways. The module can be remotely located and connector 34 can provide access to selected signal sources. The module can be positioned directly on the target component system 56 and connected via 16 directly to a pre-existing test connector on the LRU. Or, the module electronics can be fully integrated into the LRU with only the upstream 32 and downstream 33 connectors exposed.

Figure 4B:
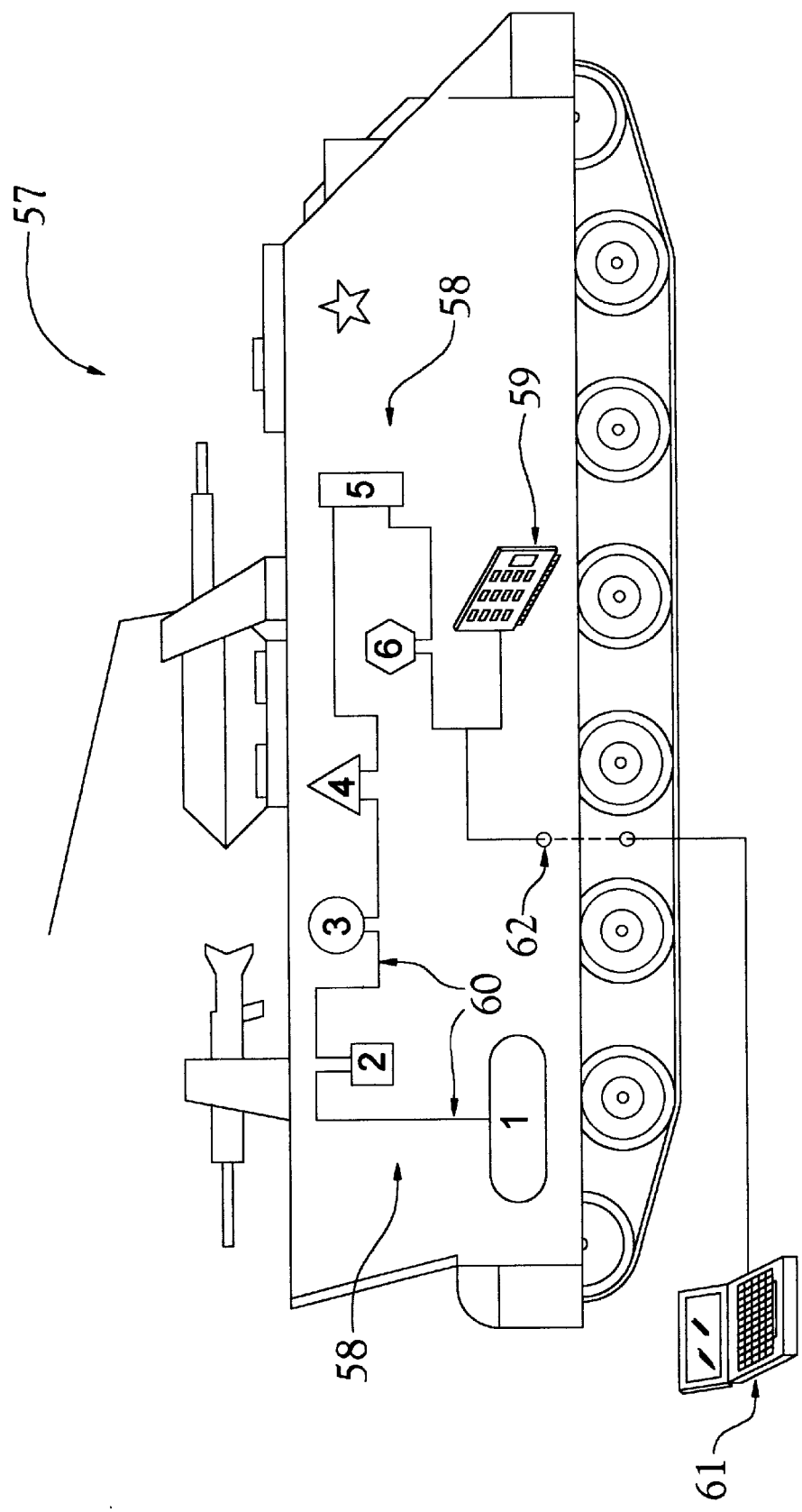
FIG. 4B is diagrammatic illustration of the measurement system installed in an armored vehicle.

As may be more easily seen in FIG. 4B, various target component systems in a tank 57 may be selected for analysis. Individual modules 10 are connected to various selected LRUs (1–6) and are connected to one another via data/power cables to create a testing network 58. The electrical function of the bus is a modified USB configuration with 4 power conductors and 2 signal conductors. The physical construct of the cable for the instant invention is more robust than a standard USB shielded cable in favor of a double shielded conduit assembly having an outer jacket, a type 1 EMF shield, and an inner liner (e.g. MIL-T-81914/2), and a central core of six conductors. The power for each individual measurement module 10 is supplied from an external power supply via the 4 power conductors of the measurement interconnect cables 60. The power supply source exists at the host computing point of either 59 or 61, and provides +8VDC, +15VDC, -15VDC, and Ground. Each upstream connector 32 of each module is connected to a downstream connector 33 of an adjacent LRU except for a terminating system with each connector including a dust cover. For example, LRU 1 terminates the testing network 58, but is connected via its upstream connector 34 to the downstream connector 32 of LRU 2. LRU 2 is in turn connected to LRU 3 via its upstream connector, and so on. LRUs 1–6 combine over the USB to form a full testing lattice.

A host computing device accesses and analyzes data via the individual modules 10. The host computing device can take the form of an on board printed circuit wire board 59 to take advantage of other input/output devices that may be available within a tank's 57 system, or it may take the form of a separate notebook computer 61 that has connected access to the modules via the USB via a temporary access port 62. In either case, the host computing device and complementary power supply provide power and data command instructions to each of the modules 10 attached to each of the target systems 1–6, and must have sufficient processing power to run a testing application and interface with the USB.

Since command instructions from a host computing device are required to activate a module into a data collection mode, real-time operational analysis of target LRUs would necessitate either the permanent installation of a host computing board, or the bringing on board of a notebook computer with the vehicle. Due to the structure of USB, any module connected to a LRU may be connected and disconnected from the testing network at any time. Generally, any module is hot-swappable to the testing network 58 at any selected moment. Hence, new LRUs in a tank's system may be connected at will by simply wiring a module into the LRU to access the selected source signals of the LRU. This feature allows for inclusion of all LRUs in a tank system over an extended time period to allow for the upgrading of LRUs having desirable testing points. Obviously, a USB electrical connection must be maintained to each module.

Referring now to FIGS. 5–9, it is important to realize pertinent capabilities and features of USB for a proper understanding of the invention. A complete description of USB is not necessary for a complete understanding of the invention, however some understanding of the underlying USB communication architecture is necessary to understand the structure of the invention's communications protocols. The present invention implements USB version 1.1 (9-28-98), and the complete USB version 1.1 is readily accessible over the Internet at the USB consortium web page www.usb.or. The specification 1.1 is hereby incorporated by reference and specification terminology and concepts shall be readily recited from version 1.1 hereafter.

The USB physical interconnection is a tiered star topology. A hub is at the center of each star, and each wired segment is a point-to-point connection between a host and a hub or function, or a hub connected to another hub or function. All USB devices are either a host, a hub, a function, or a compound device. A compound device appears to other devices on the USB as a hub with one or more non-removable USB devices. The measurement module 10 in our testing system acts as such a compound device.

The USB allows devices to be added and removed during full operation of the bus. All USB devices attach to the USB through ports on specialized USB devices known as hubs. Hubs have status indicators that indicate the attachment or removal of a USB device on one of its ports. The host queries the hub to retrieve these indicators. In the case of an attachment, the host enables the port and addresses the USB device through the device's control pipe at the default address. The host then assigns a unique USB address to the device and then determines if the newly attached USB device is a hub or a function. The host then establishes its end of the control pipe for the USB device using the assigned USB address and endpoint number zero. If the attached USB device is a hub and USB devices are attached to its ports, then the above procedure is followed for each of the attached USB devices. If the attached USB device is a function, then attachment notifications will be handled by host software that is appropriate for the function.

Attachment of a new device to the USB initiates a bus enumeration sequence. Enumeration allows each device to be identified and assigned a unique address. Because the USB specification allows for attachment or detachment from the bus at any time, bus enumeration is an on-going activity for USB system software.

USB supports functional data and control exchange between the USB host and a USB device as a set of either uni-direction or bi-directional pipes. USB data transfers take place between host software and a particular endpoint on a USB device. These associations between the host software and the USB device endpoint are called pipes. The USB architecture utilizes four basic types of data transfers: control transfers; bulk data transfers; interrupt data transfers; and isochronous data transfers.

Each measurement module 10 of the present invention contains a hub, an internal function, and one downstream port for connection to other modules. Upon connection of a module to the host computing device, such as 59 or 61, the hub and internal function proceed through the USB enumeration process that configures and assigns an address to the module, thereby preparing it for communication over the USB. The enumeration process typically takes 1 to 2 seconds, and thereafter the module is ready to accept commands from the host computing device (hereinafter "host"). As additional modules are attached to the USB each shall go through the same enumeration process such that each is assigned a unique address on the bus.

After enumeration, each module establishes specific endpoints at the hub and function device levels. Each hub includes two endpoints and each function contains three endpoints through which the host computing device communicates. For each module in the present invention, the hub and function endpoint configurations appear as follows:

TABLE 1.0

Endpoint Assignments

| | |
|---|---|
| Hub Endpoint 0 | Control (setup tokens) |
| Hub Endpoint 1 | Interrupt (port change info. only) |
| Function Endpoint 0 | Control (setup tokens) |
| Function Endpoint 1 | Bulk Transmit (i.e. Function to Host) |
| Function Endpoint 2 | Bulk receive (i.e. Host to Function) single-packet mode |

The control and interrupt endpoints are used during enumeration and at any time at which a configuration change is detected by the host computing device. The two endpoints with which a la host's testing application shall access a module's functions are endpoints 1 and 2, which are uni-directional pipes. A host application sends commands to the module via function endpoint 2, and data is received back via function endpoint 1. For clarity, transmit (tx) and receive (rx) are shown in the above table from a module's reference point. To be consistent with the USB specification 1.1, function endpoint 2 is labeled the Write Pipe, and function endpoint 1 is labeled the Read Pipe.

Prior to the host recognizing a newly attached module on the bus, an information file must be loaded into memory on the host. Upon connection of a new module on the USB, the host recognizes the existence on the bus of a new device and asks the user for an appropriate driver. The file USB.inf already present on the host is accessed and utilized as the correct interface driver for the hub portion of the module, and the file SIDECAR.inf present on the host shall be accessed and utilized as the interface driver for the function portion of the module. USB enumeration shall then proceed for the new module. Each of these files is a standard driver written to enable the host to communicate with the modules over the USB.

After enumeration, the module is prepared to respond to four basic host commands:

TABLE 2.0

Host Commands

| Command | Action Translation |
|---|---|
| Single List Measurement | Measure a single selected source signal once. |
| Dual List Measurement | Measure two selected source signals simultaneously once. |

TABLE 2.0-continued

Host Commands

| Command | Action Translation |
|---|---|
| Single Waveform | Measure a single selected source signal continuously for XX XX cycles. |
| Dual Waveform | Measure two selected sources signals continuously for XX XX cycles. |

Each of the above commands is transmitted over the Write Pipe, and any module response shall be sent via the Read Pipe. These commands must be correctly embedded within a valid USB bulk transaction with actual command residing in the Data Phase. For the Write Pipe, a valid bulk transaction would consist of an OUT Token, then data, then a handshake signal. For the Read Pipe, a valid bulk transaction would consist of an IN Token, then data, then a handshake. Further explanation of USB transactions, phases, and packet structure may be found in USB specification 1.1 already referenced.

Two firmware embodiments for the measurement module 10 exist that implement two slightly different sets of host commands. The first embodiment utilizes the data stream shown below for each host instruction:

TABLE 3.0

Command Set (Embodiment One)

| Command | Resultant Data Stream (host->function, Hexadecimal Values) |
|---|---|
| Single List Measurement | 02 HI LO |
| Dual List Measurement | 82 HI LO HI LO |
| Single Waveform | 03 XX XX HI LO |
| Dual Waveform | 83 XX XX HI LO HI LO |

Legend:
HI = A target signal number.
LO = A reference signal number.
XX XX = a 16 bit cycle count (number of measurements performed in hexadecimal).

The data phase of embodiment one for a bulk transaction returned to the host via the Read Pipe will depend on the particular command sent. Upon receipt of a command by a module, analog to digital sampling occurs continuously in AID 43 until sampled data stored in the SRAM 46 is ready to be transmitted back to the host. The maximum data packet size that a module 10 can transmit back to the host is 8 bytes. For sampling data greater than 8 bytes, a module simply sends multiple 8 byte data packets until all sampling data present in the SRAM 46 associated with a particular command sequence has been transmitted to the host. Measurement values taken by a module are represented as hexadecimal voltages. Table 4.0 below shows a listing of expectant data returns from each function to host for each host command:

TABLE 4.0

Expectant Return Data by Command (Embodiment One)

| Command | Resultant Data Stream (function->host, Hexadecimal Values) |
|---|---|
| Single List Measurement | 2 bytes sampled data |
| Dual List Measurement | 4 bytes sampled data |

TABLE 4.0-continued

Expectant Return Data by Command
(Embodiment One)

| Command | Resultant Data Stream (function->host, Hexadecimal Values) |
| --- | --- |
| Single Waveform | 2 x (XX XX) bytes sampled data |
| Dual Waveform | 4 x (XX XX) bytes sampled data |

Embodiment two of the command set allows for controlled waveform sampling rates by allowing for the insertion of read time delays through microcontroller 31 intervention. The resultant command set and resultant data streams appear below in tables 5.0 and 6.0:

TABLE 5.0

Command Set (Embodiment Two)

| Command | Resultant Data Stream (host->function, Hexadecimal Values) |
| --- | --- |
| Single List Measurement | 02 HI LO |
| Dual List Measurement | 82 HI LO HI LO HI LO |
| Single Waveform (Fast) | 03 XX XX HI LO |
| Dual Waveform (Fast) | 83 XX XX HI LO HI LO |
| Single Waveform (Slow) | 43 XX XX TT HI LO HI LO |
| Dual Waveform (Slow) | C3 XX XX TT HI LO HI LO |

Legend:
HI = A target signal number.
LO = A reference signal number.
XX XX = A 16 bit cycle count (number of measurement performed in hexadecimal).
TT = Delay time between samplings.
Fast = Samplings are performed continuously without delay insertions.
Slow = Samplings are performed continuously with delay insertions.

TABLE 6.0

Expectant Return Data by Command
(Embodiment Two)

| Command | Resultant Data Stream (function->host, Hexadecimal Values) |
| --- | --- |
| Single List Measurement | 2 bytes sampled data |
| Dual List Measurement | 4 bytes sampled data |
| Single Waveform (Fast) | 2 x (XX XX) bytes sampled data |
| Dual Waveform (Fast) | 4 x (XX XX) bytes sampled data |
| Single Waveform (Slow) | 2 x (XX XX) bytes sampled data |
| Dual Waveform (Slow) | 4 x (XX XX) bytes sampled data |

For embodiment two, analog to digital sampling occurs continuously until sampled data stored in the SRAM 46 is ready to be transmitted back to the host. The maximum data packet size that a module 10 with firmware embodiment two can transmit back to the host is 1024 bytes. For sampling data greater than 1024 bytes, a module simply sends multiple 1024 byte data packets until all sampling data present in the SRAM 46 associated with that particular command sequence has been transmitted to the host. Hence, except for packet size, data transmission procedure from the module to the host are similar.

Figure 5:
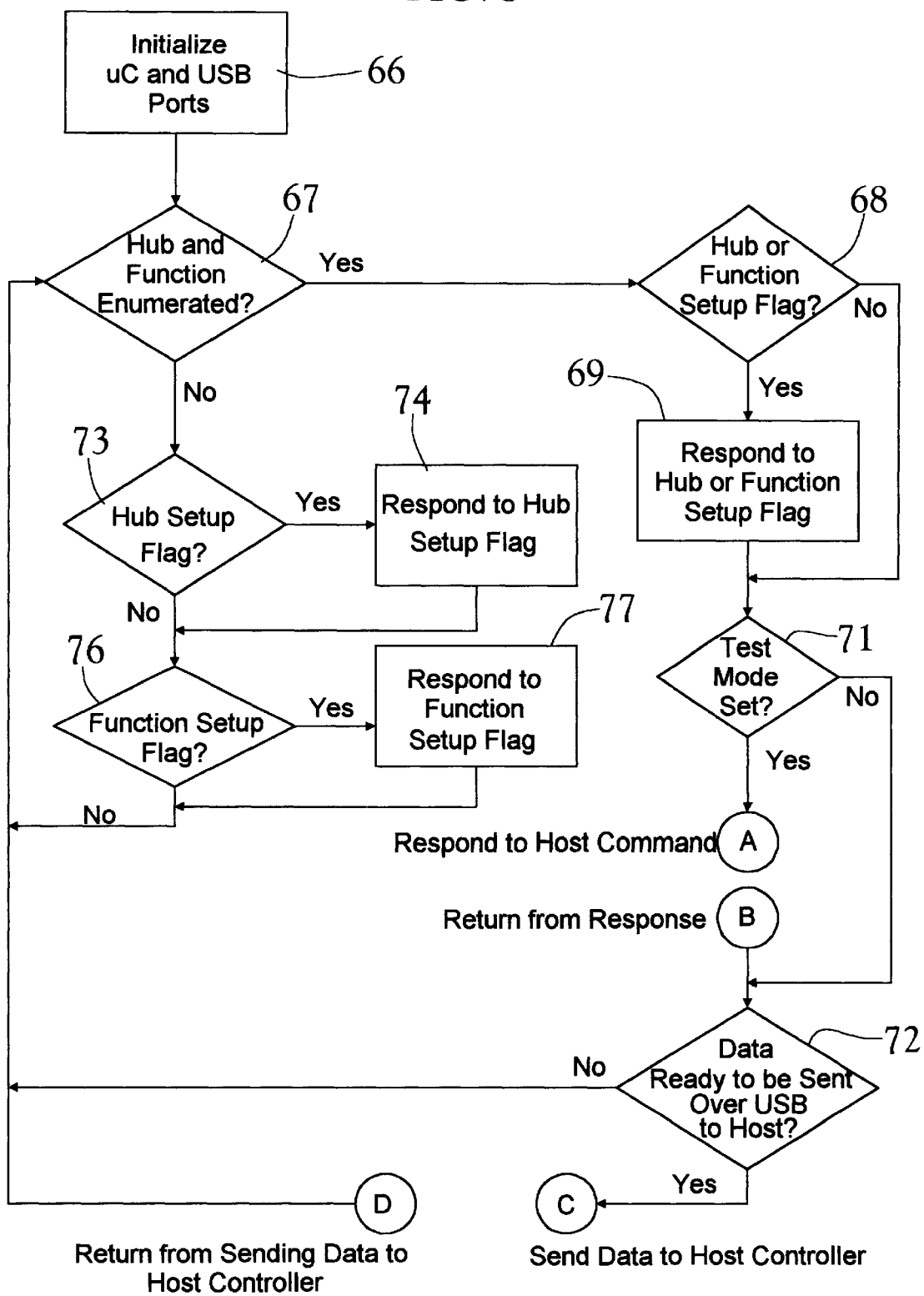
FIG. 5 is a system flowchart showing the top level processing steps of the measurement module anticipating a testing command from the host computing device.

Referring now to FIGS. 5–9, processing flow of host commands and transmission of sampling data for the invention may be more easily understood. FIG. 5 shows the top level processing flow for a measurement module anticipating the receipt of a testing command from the host. Ports must first be initialized 66 and the hub and function devices enumerated 67. After enumeration, a hub or function setup flags are set 68 and the module is ready 69 to respond to hub or function commands. The module then enters test mode 71 in preparation to receive host commands A and begin a data sampling procedure. After completing a data sampling procedure B, data is sent to the host via process C if data ready flag (Data_Ready) has been set 72. If data is not ready to be sent, the enumerations process may need to be executed 67. Hub and function devices in the module 10 are setup according to steps 73, 74, 76, and 77 as shown (see FIGS. 8 and 9). Top level processing is also regained upon completion of sending data to the host D.

Figure 6:
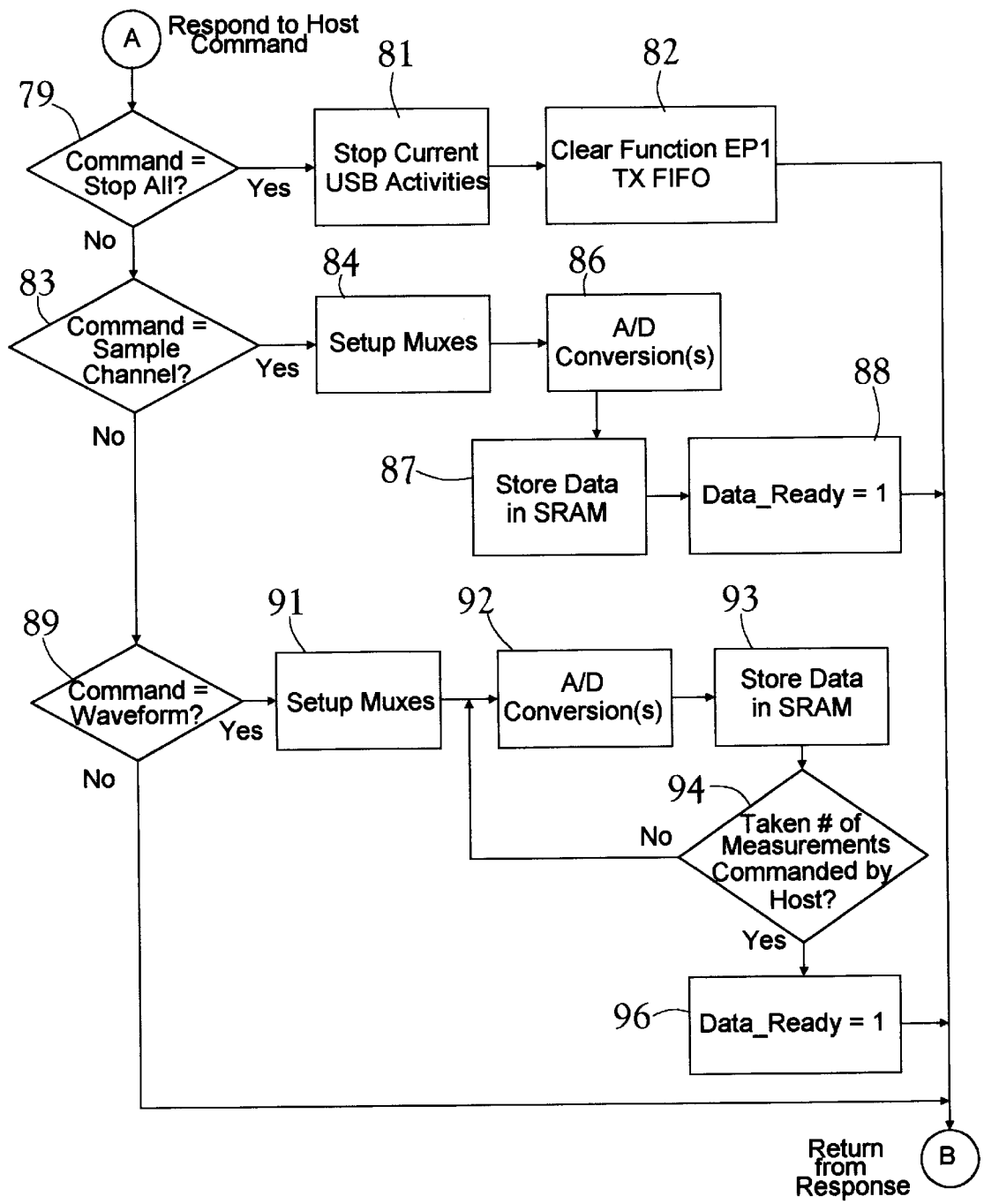
FIG. 6 is a system flowchart showing the processing steps taken by the measurement module in responding to a measurement command from the host computing device.

Referring to FIG. 6, process A corresponds to a module's response to receipt of a host command. If a stop all command is received 79, all USB activities are ceased 81 and a clearing function via control endpoint 1 (EP1) is executed 82 to clear the transmit FIFO memory. If a host command is received instructing the module to execute a single sampling measurement 83 (whether single or dual channels), then multiplexers 38, 39 are configured 84 to properly select the target signal number embedded in the instruction. Analog to digital conversion(s) 86 then occur on the connected target signals and stored 87 in SRAM 46. A Data_Ready flag is then set to true 88 and control is returned to the top level process B.

If a waveform instruction is received by the module 89, then multiplexers 38, 39 are again configured 91 to access the specified target signal and sampling conversions proceed 92 with the results stored in memory 93. The waveform instruction specifies the number of samples to be taken by the A/D 43 as well as any intervention delay between each conversion event (see Table 5.0). Samples are taken continuously until the number of samples acquired matches the specified value in the host waveform command 94. The steps in loop 92, 93, and 94 repeat, therefore, for the specified number of sampling cycles. Once the maximum number of samples is taken, Data_Ready flag is set to true 96 and control is returned to the top level process B.

Figure 7:
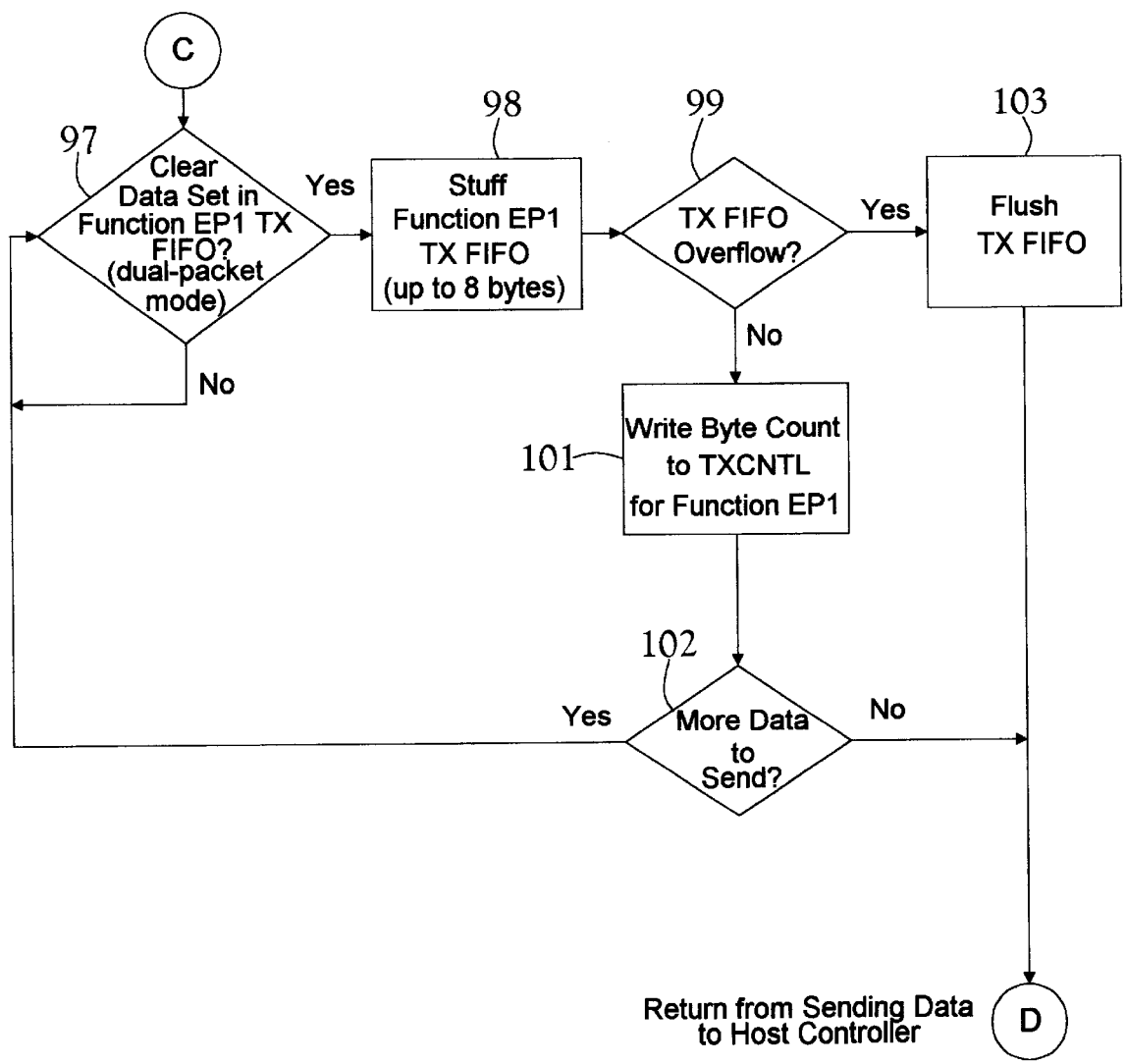
FIG. 7 is a system flowchart showing the processing steps taken by the measurement module to transmit data to the host computing device.

Once data is stored, the Data_Ready flag set to true, and the top level process (shown in FIG. 5) resumes on the module, data may then be sent to the host through the process shown in FIG. 7. Initially, existing data in the Transmit FIFO (TX FIFO) may be cleared 97 and new data stored in SRAM 46 is loaded 98 into TX FIFO in up to 8 byte increments. Flow control of data into the TX FIFO occurs through steps 99, 101, and 102, and data is transmitted to the host 103 in either 8 byte or 1024 bytes packets, depending upon which firmware embodiment has been installed. Once data has been exhausted, control is returned 102 to the top level process D.

Figure 8:
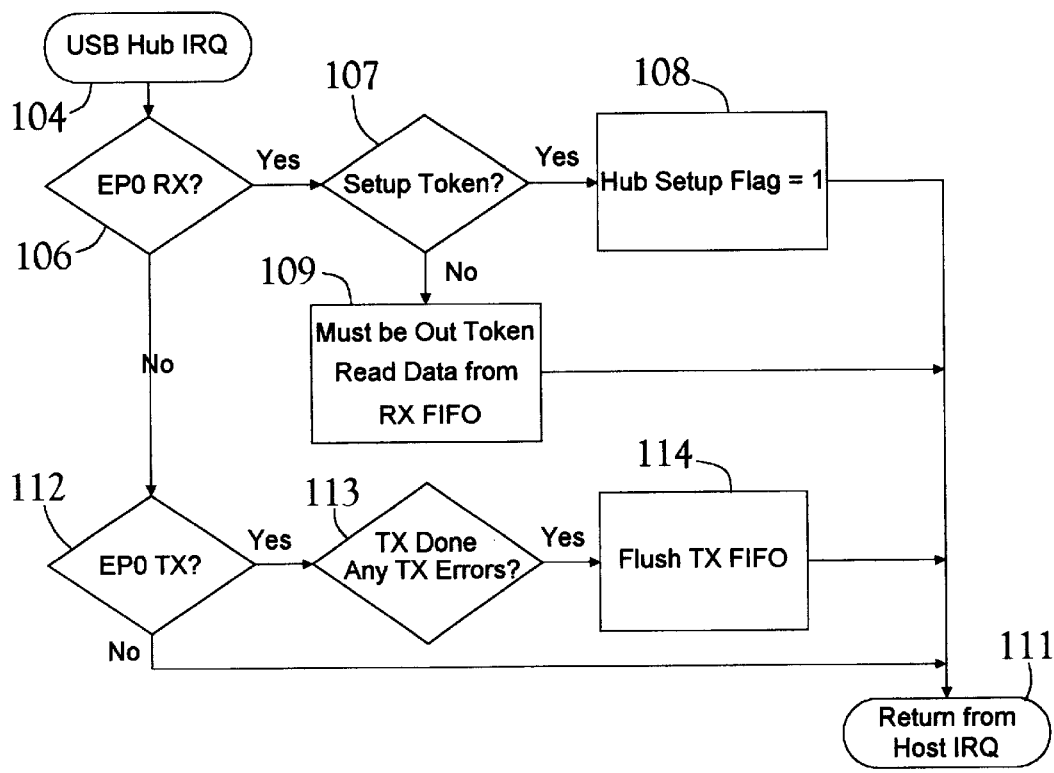
FIG. 8 is a system flowchart showing the processing steps taken by the measurement module as a hub device in communicating with the host computing device; and, FIG. 9 is a system flowchart showing the processing steps taken by the measurement module as a proprietary function device in communicating with the host computing device.

The USB hub device in the module is setup according to the process shown in FIG. 8. An interrupt is sent 104 and if a hub received endpoint 0 (EPO RX) is encountered 106 then a hub setup flag is set to true 108 if a setup token is encountered 107. If no setup token is encountered, then data is read 109 from the receive FIFO memory (RX FIFO) and control returned 111. If a hub transmit endpoint 0 (EPO TX) is received 112, transmission errors are looked for 113 and if any found then the TX FIFO is cleared 114. Control is then returned to the host 111.

Figure 9:
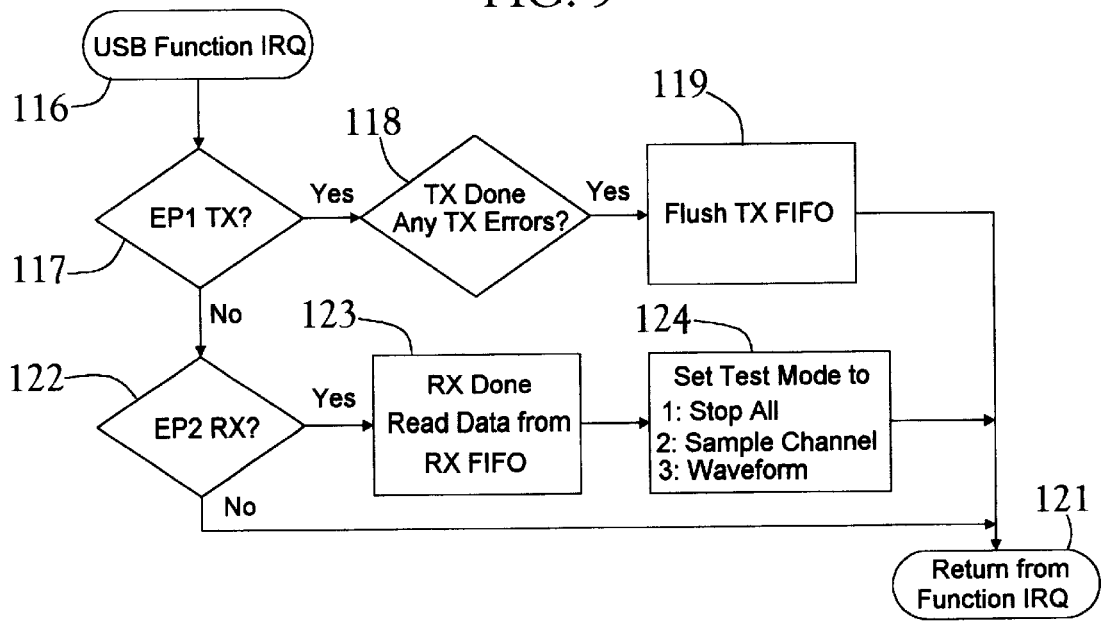

The USB function device is setup according to the process shown in FIG. 9. An interrupt is sent 116 and if transmission function endpoint 1 is encountered 117, then transmission errors are looked for 118 and the TX FIFO is cleared 119 if any are found. If receive function endpoint 2 is encountered 122, then data is read from the RX FIFO 123 and the appropriate test mode initiated 124. Control is then returned to the host 121.

The heart of the present invention is the measurement modules 10, but the present invention also includes the interaction of multiple measurement modules with a host computing device controlling the acquisition of sampling data for each connected LRU having an assigned module. The structure of the aforementioned module processing procedures in conjunction with the stated host command structure, allows an entire testing system to be incorporated in any vehicle. The present invention provides the structure for a testing application to quickly access selected electronic components in any system, whether vehicle based or other, and extract relevant testing data for preselected signal sources in each electronic component and evaluate that data to ascertain the operational status of each component. Realization of a complete testing environment requires an appropriate testing application to be resident on the host computing device, however.

One example of a satisfactory testing application is Lab-VIEW offered by National Instruments, Inc. LabVIEW is a graphical programming environment that combines graphical development with the flexibility of a powerful programming language. With a LabVIEW application, a tightly integrated testing environment can be created based upon measurement hardware, such as the presently contemplated measurement module 10. The LabVIEW application offers routines for data acquisition, data analysis, live data presentation on a display device, analysis libraries, and support for ActiveX, SQL databases, RS-232/485, and DLL library support. With appropriate drivers, USB integration provides for direct access to sampling data at each module and live analysis of each target component or LRU can be achieved.

With an application such as LabVIEW loaded on a notebook computer, maintenance engineers in the field can connect through a port 62 such as shown in FIG. 4B, and perform maintenance testing on all LRUs connected to the USB testing bus through a module 10. It is contemplated that a library of canned testing functions written for each component to be tested can be accessed on demand and a series of specific testing procedures can be implemented to fully interrogate the status and present functionality of any LRU.

While I have shown my invention in one form, it will be obvious to those skilled in the art that it is not so limited but is susceptible of various changes and modifications without departing from the spirit thereof.

Having set forth the nature of the present invention, what is claimed is:

1. A method for measuring the condition of a target system with a measurement module in electrical communication with said target system, compressing the steps of:
   a. said module receiving measurement, command from a host computing device;
   b. configuring at least one multiplexor in said module to access a selected signal from said target system;
   c. converting said signal from an analog state into a representative digital measurement;
   d. storing said digital measurement in a memory device; and,
   e. transmitting said digital measurement to said host computing device for analysis, wherein said step of transmitting said digital measurement to said host comprises the steps of:
      e-1. determining whether a data ready variable is true;
      e-2. if said data ready variable is true then performing the following steps i–iv:
         i. filling a transmit FIFO with up to 8 bytes of data from a sampling data set;
         ii. determining whether said FIFO is fill;
         iii. If FIFO is full then sending all FIFO data to said host computing device, otherwise determining whether more data is available from said sampling data set;
         iv. if no more data is available from said sampling data set then transmitting contents of said FIFO to said host computing device;
      e-3. repeat step e-1.

2. A method for measuring the condition of a target system with a measurement module in electrical communication with said target system, comprising the steps of:
   a. said module receiving measurement command from a host computing devices;
   b. configuring at least one multiplexor in said module to access a selected signal from said target system;
   c. converting, said signal from an analog state into a representative digital measurement, wherein said step of converting said signal comprises the steps of:
      i. determining whether single or waveform target samples shall be taken of said target signal;
      ii. storing a measurement count prescribed by said host computing device;
      iii. converting said target signal into a digital value and storing said digital value in memory;
      iv. if waveform target samples are to be taken then repeating step ii the number of times prescribed in said measurement count; and,
      v. setting a data ready variable state to true;
   d. storing said digital measurement in a memory device; and,
   e. transmitting said digital measurement to said host computing device for analysis.

3. A method for measuring the condition of a target system with a measurement module in electrical communication with said target system, comprising the steps of:
   a. said module receiving a measurement command from a host computing device;
   b. configuring at least one multiplexor in said module to access a selected signal from said target system;
   c. converting said signal from an analog state into a representative digital measurement;
   d. storing said digital measurement in a memory devices
   e. transmitting said digital measurement to said host computing device for analysis, wherein said step of transmitting said digital measurement to said host comprises the steps of:
      e-1. determining whether a Data Ready variable is true;
      e-2. if said Data Ready variable is true then performing the following steps i–iv:
         i. filling a transmit FIFO with up to 8 bytes of data from a sampling data set;
         ii. determining whether said FIFO is full;
         iii. If FIFO is full then sending all FIFO data to said host computing device and repeating step i;
         iv. if no more data is available from said sampling data set then transmitting contents of FIFO to said host computing device;
      e-3. repeat step 1; and
   f. receiving and decoding a command instruction having a structure selected from the group consisting of 02 HI LO, 82 HI LO HI LO, 03 XX XX HI LO, 83 XX XX HI LO HI LO, 43 XX XX TT HI LO, and C3 XX XX TT HI LO HI LO.

4. A measurement method as recited in claim 3, wherein said step of converting said signal comprises the steps of:
  a. determining whether single or waveform target samples shall be taken of said target signal;
  b. storing a measurement count prescribed by said host computing device;
  c. converting said target signal into a digital value and storing said digital value in memory;
  d. if waveform target samples are to be taken then repeating step b the number of times prescribed in said measurement count; and,
  e. setting a data ready variable state to true.

5. In a measurement module having a memory device for storing test data acquired from a target system, isolation circuitry for safely interfacing with said target system, an analog multiplexor for selecting a source of sampling data from said target system, a digitizer for acquiring sampling data from said target system, a diagnostic bus interface for transferring said test data to a host computing device, and microcontroller having a set of pre-programmed computer instructions for controlling said module, a method for measuring the condition of said target system, comprising the step of:
  a. receiving a measurement command from a host computing device;
  b. configuring said analog multiplexor to select a signal source from said target system;
  c. converting said seleted target signal source into a representative digital measurement;
  d. storing said digital measurement in a memory device; and,
  e. transferring said digital measurement to said host computing device for analysis, wherein said step of transferring said digital measurement to said host comprises the steps of:
    e-1. determining whether a Data Ready variable is true;
    e-2. if said Data Ready variable is true then performing the following steps i–iv:
      i. filling a transmit FIFO with up to 8 bytes of data from a sampling data set;
      ii. determining whether said FIFO is full;
      iii. If FIFO is full then sending all FIFO data to said host computing device and repeating step i;
      iv. if no more data is available from said sampling data set then transmitting contents of FIFO to said host computing device;
    e-3. repeat step e-1;
  f. receiving a command instruction having a structure selected from the group consisting of 02 HI LO, 82 HI LO HI LO, 03 XX XX HI LO, 83 XX XX HI LO HI LO, 43 XX XX TT HI LO, and C3 XX XX TT HI LO HI LO; and,
  g. said microcontroller decoding said command instruction and issuing a selection coding sequence said multiplexor for connecting a selected target signal source to said digitizer.

6. A measurement method as recited in claim 5, wherein said step of converting said signal source comprises the steps of
  a. determining whether single or waveform target samples shall be taken of said target source;
  b. storing a measurement count as prescribed in said measurement command;
  c. converting said target signal source into a digital value and storing said digital value in memory;
  d. if waveform target samples are to be taken then repeating step b the number of times prescribed in said measurement count; and,
  e. setting a data ready variable state to true.

* * * * *

UNITED STATES PATENT AND TRADEMARK OFFICE
CERTIFICATE OF CORRECTION

PATENT NO. : 6,697,763 B1
DATED : February 24, 2004
INVENTOR(S) : Debora Wilkins et al.

It is certified that error appears in the above-identified patent and that said Letters Patent is hereby corrected as shown below:

Column 11,
Line 49, change "compressing" to -- comprising --
Line 50, after "receiving" insert -- a --
Line 50, delete the "," (comma) after the word "measurement"

Column 12,
Line 14, after "receiving" insert -- a --
Line 14, change "devices" to -- device --
Line 18, delete the "," (comma) after the word "converting"
Line 62, change "1" to -- e-1 --

Column 13,
Line 24, change "steps" to -- step --

Column 14,
Line 19, after "sequence" insert -- to --
Line 24, change "of" to -- of: --

Signed and Sealed this

Twenty-first Day of June, 2005

JON W. DUDAS
*Director of the United States Patent and Trademark Office*